US006284574B1

(12) United States Patent
Petrarca et al.

(10) Patent No.: US 6,284,574 B1
(45) Date of Patent: Sep. 4, 2001

(54) METHOD OF PRODUCING HEAT DISSIPATING STRUCTURE FOR SEMICONDUCTOR DEVICES

(75) Inventors: Kevin Shawn Petrarca, Newburgh; Sarah Knickerbocker; Joyce C. Liu, both of Hopewell Junction; Rebecca D. Mih, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/223,979

(22) Filed: Jan. 4, 1999

(51) Int. Cl.$^7$ .................................................. H01L 21/48
(52) U.S. Cl. .......................... 438/122; 438/626; 438/629; 438/637; 438/675; 257/712
(58) Field of Search ...................................... 438/122, 620, 438/638, 667, 668, 622, 623, 660, 661, 637, 626, 631, 629, 618, 758, 675, 657; 257/700, 712, 752, 774

(56) References Cited

U.S. PATENT DOCUMENTS

| | | |
|---|---|---|
| 4,866,507 | 9/1989 | Jacobs et al. ......................... 174/258 |
| 4,925,723 | 5/1990 | Bujatti et al. ......................... 428/137 |
| 4,941,067 | 7/1990 | Craft ..................................... 361/386 |
| 5,034,347 | 7/1991 | Kakihana ............................. 438/667 |
| 5,287,001 | 2/1994 | Buchman et al. ................... 257/719 |
| 5,371,404 | 12/1994 | Juskey et al. ........................ 257/659 |
| 5,450,283 | 9/1995 | Lin et al. ............................. 361/704 |
| 5,532,512 | 7/1996 | Fillion et al. ........................ 257/686 |
| 5,552,633 | 9/1996 | Sharma ................................. 257/700 |
| 5,625,227 | 4/1997 | Estes et al. ........................... 257/712 |
| 5,741,729 | 4/1998 | Selna .................................... 438/125 |
| 5,792,677 | 8/1998 | Reddy et al. ........................ 438/122 |
| 5,851,915 | * 12/1998 | Miyakawa ............................ 438/622 |
| 5,886,410 | * 3/1999 | Chiang et al. ....................... 257/759 |
| 5,929,476 | * 7/1999 | Prall ..................................... 257/296 |
| 6,008,084 | * 12/1999 | Sung .................................... 438/241 |
| 6,027,995 | * 2/2000 | Chiang et al. ....................... 438/623 |
| 6,080,664 | * 6/2000 | Huang et al. ........................ 438/638 |
| 6,100,195 | * 8/2000 | Chan et al. .......................... 438/687 |
| 6,121,661 | * 9/2000 | Assaderaghi et al. ............... 257/355 |
| 6,143,658 | * 11/2000 | Donnelly, Jr. et al. ............. 438/687 |
| 6,153,522 | * 11/2000 | Takagi et al. ........................ 438/687 |
| 6,177,340 | * 1/2001 | Yoo et al. ............................ 438/637 |

* cited by examiner

Primary Examiner—Olik Chaudhuri
Assistant Examiner—Alonzo Chambliss
(74) Attorney, Agent, or Firm—Jay H. Anderson

(57) ABSTRACT

A structure and process are described for facilitating the conduction of heat away from a semiconductor device. Thermally conductive planes and columns are incorporated within the back-end structure and around the interconnect outside the chip. A thermally conductive plane is formed by forming a first insulating layer on an underlying layer of the device; forming a recess in the insulating layer; filling the recess with a thermally conductive material to form a lateral heat-dissipating layer; planarizing the heat-dissipating layer to make the top surface thereof coplanar with the unrecessed portion of the insulating layer; and forming a second insulating layer on the first insulating layer and the heat-dissipating layer, thereby embedding the heat-dissipating layer between the first and second insulating layers. The heat-dissipating layer is electrically isolated from the underlying layer of the device, and preferably is electrically grounded.

5 Claims, 3 Drawing Sheets

METHOD OF PRODUCING HEAT DISSIPATING STRUCTURE FOR SEMICONDUCTOR DEVICES

BACKGROUND OF THE INVENTION

As semiconductor devices become faster and more powerful with each new generation, they also generate more heat during operation than their predecessors. The ability to dissipate this heat is a crucial factor in ensuring device reliability. As shown schematically in FIG. 1, a heat sink 99 is typically placed on the back side 91 of a semiconductor device 90 after the device is bonded to a substrate 95. In such an arrangement, a heat-dissipating structure is provided only on the exterior of device 90; heat generated within the device (generally in the active area, near the front side 92) is required to travel through the thickness of the device before it can be dissipated. There is a need for heat-dissipating structures which can be incorporated within a semiconductor device, and which can conduct heat efficiently away from the active area on the front side of the device.

SUMMARY OF THE INVENTION

In accordance with the present invention, a structure and process are provided to facilitate the conduction of heat away from a semiconductor device. This is achieved by incorporating highly conductive planes and columns within the back-end structure and around the interconnect outside the chip. A thermally conductive plane is formed by forming a first insulating layer on a substantially planar underlying layer of the device; forming a recess in the first insulating layer; filling the recess with a thermally conductive material to form a lateral heat-dissipating layer; planarizing the heat-dissipating layer to make the top surface thereof coplanar with the unrecessed portion of the first insulating layer; and forming a second insulating layer on the first insulating layer and the heat-dissipating layer, thereby embedding the heat-dissipating layer between the first and second insulating layers. The heat-dissipating layer is electrically isolated from the underlying layer of the device.

According to the present invention, the recess in the first insulating layer is formed using a mask pattern and a resist material, while an opening in the insulating layers, exposing the underlying layer of the device, is formed using the same mask pattern and a different resist material. The formation of the lateral heat-dissipating structure thus does not require an additional mask.

A vertical heat-dissipating structure is formed by forming an opening in the second insulating layer to expose a portion of the lateral heat-dissipating layer, and filling that opening with a thermally conductive material to make thermal contact with the lateral heat-dissipating layer. Additional device levels, or additional lateral or vertical heat-dissipating structures, may be formed on top of the second insulating layer.

An additional benefit of the heat-dissipating structures can be realized by connecting them to ground, thereby reducing the noise component within the semiconductor device.

DETAILED DESCRIPTION OF THE PREFERRED EMBODIMENTS

In the first embodiment described below, a thermally conducting layer is incorporated in the structure of a semiconductor device as a via damascene level. A different level or structure may be used with minor process adjustments familiar to those skilled in the art. For example, etch-back and gap fill processes could be employed in place of damascene processes.

Figure 2A:
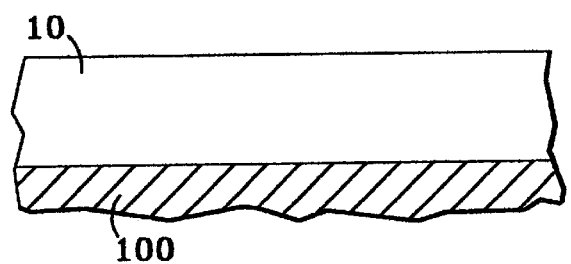
FIGS. 2A–2H show successive steps for incorporating a lateral heat-dissipating layer in a semiconductor device, in accordance with a first embodiment of the present invention.
Figure 2B:
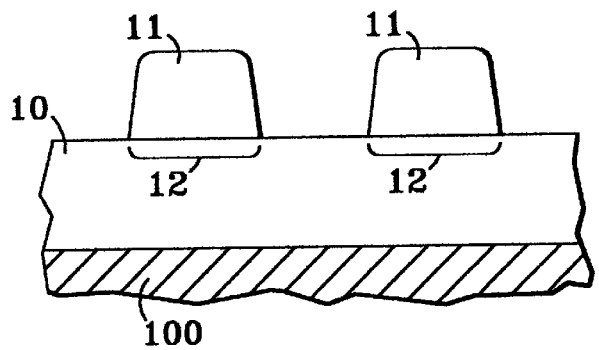
Figure 2C:
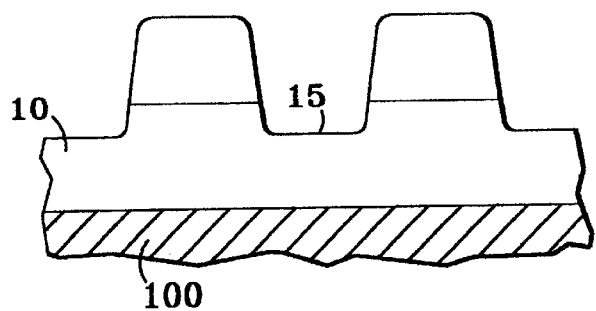
Figure 2G:
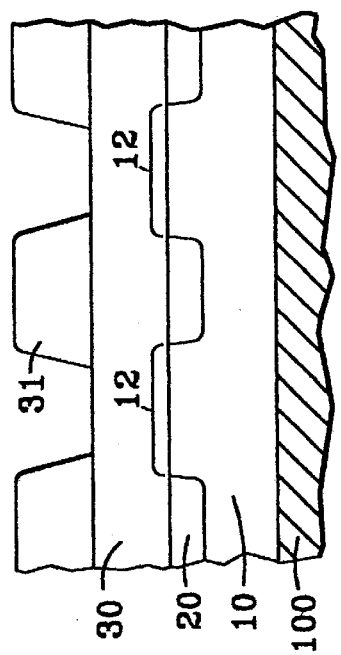
Figure 2H:
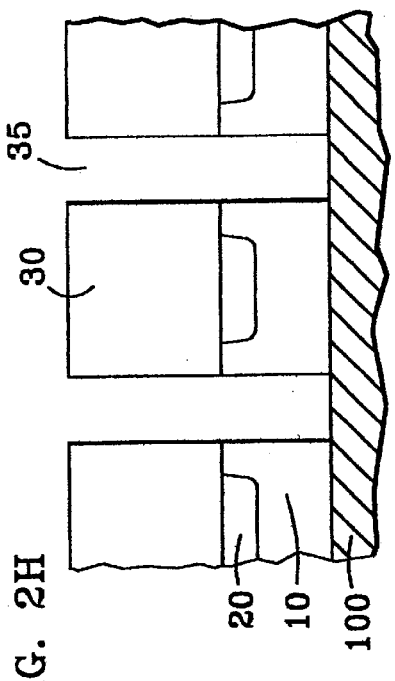
Figure 2D:
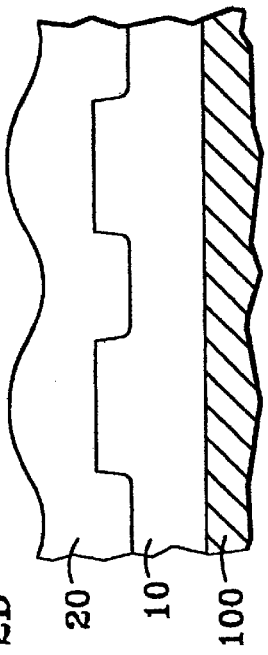
Figure 2E:
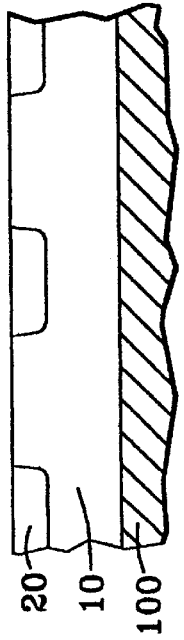

FIG. 2A shows the starting point of the fabrication process for the heat-dissipating layer. An insulating layer 10 is first deposited on an underlying level 100 of the device. This insulator may be silicon nitride, TEOS, phosphosilicate glass (PSG) or of some other type. In the next step, shown in FIG. 2B, photoresist 11 is deposited on insulator 10 and patterned using well-known lithography techniques. Photoresist 11 is preferably a negative photoresist which is overexposed, thereby yielding covered areas 12 larger than the via holes in the lithographic pattern. This pattern is then etched into the insulator 10. The etch process may be a Reactive Ion Etch (RIE) with a CF4 chemistry for oxide or C2F6 for nitride, or a wet etch (such as HF acid for etching SiO2). As shown in FIG. 2C, pattern features 15 are etched into the insulator 10; the remaining resist is then removed with an $O_2$ plasma treatment. A conducting material 20 is then deposited on the etched insulator 10, as shown in FIG. 2D. For optimal results, a metal with a high thermal conductivity such as Cu should be used. Tungsten, aluminum or some other metal could also be employed. It is important to planarize the conducting layer 20 at this point, so that the upper surface of layer 20 is coplanar with the upper surface of features 15 (see FIG. 2E). A preferred planarization process is chemical-mechanical polishing (CMP).

Figure 2F:
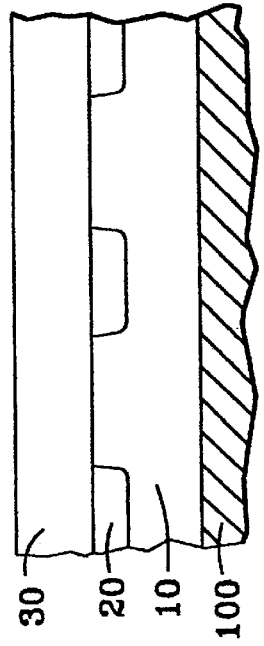

As Shown in FIG. 2F, another insulating layer 30 is then deposited over the metal. This layer 30 then has a positive photoresist 31 deposited thereon and patterned (see FIG. 2G). The pattern (in this example, a pattern of via holes) is then etched into the insulator 30 and the photoresist 31 removed, leaving via holes 35 extending through the insulating layers 30 and 10 (see FIG. 2H).

Figure 3:
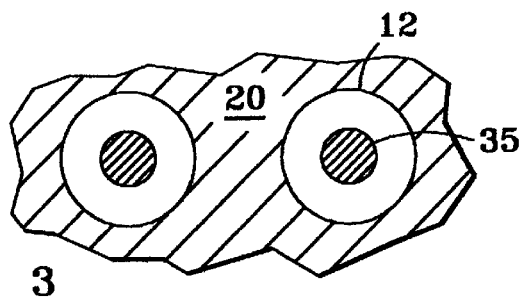
FIG. 3 shows a lateral heat-dissipating layer surrounding a via structure, in accordance with the first embodiment of the invention.

It should be noted that the patterning of insulator layers 10 and 30 is performed using the same lithographic mask. This ensures that unetched areas 12 (oversized due to the overexposure of negative resist 11) are aligned to via holes 35. Accordingly, the via holes may be filled with metal (to make electrical connection to devices at the underlying level 100) without shorting to the heat-dissipating layer 20. With this arrangement, the heat-dissipating conducting layer 20 is embedded in the device structure without disrupting the pattern of the device layers. FIG. 3 shows a top-down view of the structure of FIG. 2H, after via metallization, through insulator layer 30. The heat-dissipating conductive layer 20 surrounds areas 12; the via hole 35, filled with metal, connects to the functional metal of the chip. Further processing may then be performed to add more levels to the device. It will be appreciated that the heat-dissipating layer is incorporated in the device without the need for an additional lithographic mask.

An alternative approach to building large area metal planes within a level would be to design the planes into the layer, placing metal planes around the functional metallurgy. This layer could be either a via or wiring level. This has the advantage of cost but the disadvantage of complicating other processes on this level. Furthermore, in these levels only a limited amount of additional metal can be incorporated. Only the "blank" (that is, nonfunctional) areas of the level can be metallized.

Figure 4A:
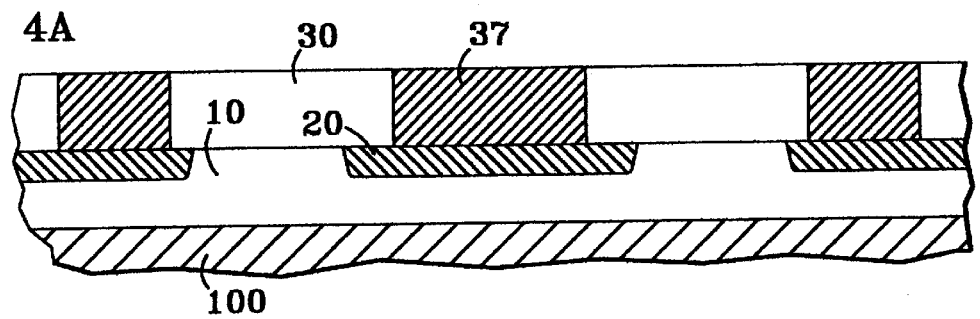
FIG. 4 shows a vertical heat-dissipating structure incorporated in a semiconductor device, in accordance with a second embodiment of the present invention.
Figure 4B:
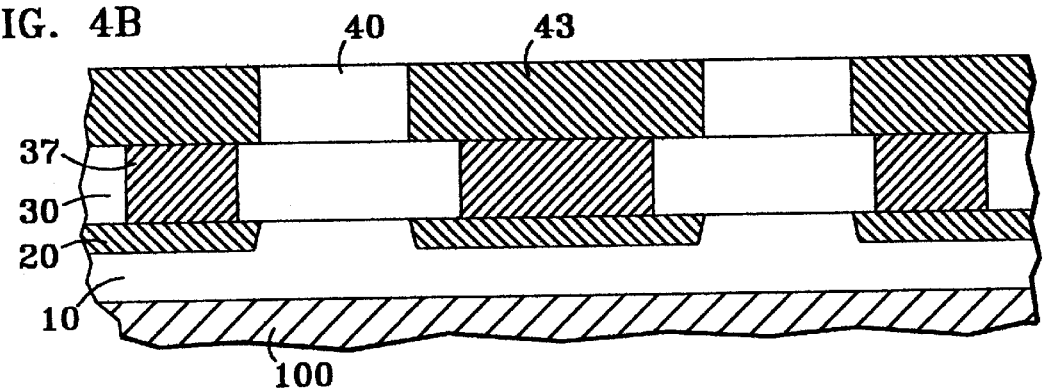

The conductive layer 20 described above is suitable for conducting heat in the lateral direction. In a second embodiment of the invention, a vertical heat-dissipating structure is added to conduct heat in a direction perpendicular to the active area of the chip. These vertical structures can be formed by opening holes 37 in the insulator 30 above the heat-conductive layer 20 and then filling holes 37 with metal, as shown in FIG. 4A. A damascene process (using etching, plating and planarization) may be used to form and fill the holes 37. As in the first embodiment, it is preferable to use a metal with a high thermal conductivity such as Cu, W or Al. An additional insulator layer 40 may then be deposited and patterned using the same technique as for layer 10. Etching through layer 40, and then filling etched areas 43 with metal, results in a second large-area metal plane with the same pattern as layer 20, and connected thereto vertically through metallized holes 37 (see FIG. 4B). The greater the number of such vertical structures, the better the heat conduction will be from the active area of the device. This configuration may also enhance the structural integrity of the device by adding to the overall strength of the completed semiconductor device.

Figure 5:
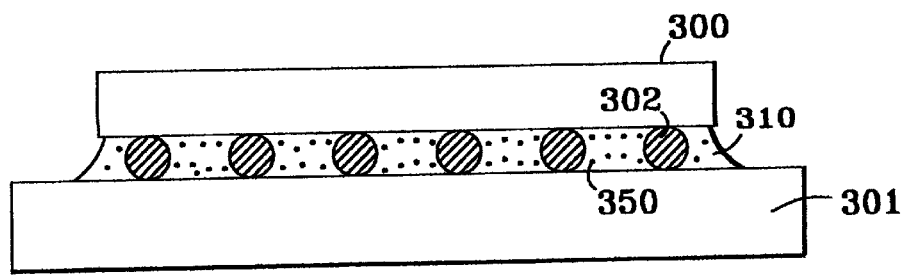
FIG. 5 shows an arrangement for conducting heat from the front side of a semiconductor device.

It is noteworthy that the embedded heat-dissipating layers, formed during back-end-of-line processing, are located close to the front surface of the device. Additional heat dissipating features may be incorporated in the combined device/substrate package after the back-end-of-line structure has been metallized. As shown schematically in FIG. 5, the completed semiconductor device 300 is bonded to a substrate 301 using controlled-collapse-chip-connection (C4) structures 302. Typically, the C4 structures are surrounded with an electrically non-conductive material 310, often referred to as underfill or EPX, which enhances the reliability of the C4 structures. This underfill material has fine particles 350 dispersed therein; these particles may be metal such as Cu, or highly thermally conductive, electrically insulating particles such as AlN or BN. The placement of these highly thermally conductive particles within the underfill facilitates heat conduction from the front surface of the device 300 and into the substrate 301 without compromising the function of the underfill.

To ensure reliable operation of the device, the heat-dissipating structures should be electrically grounded. This may be accomplished by connecting the structures (for example, the vertical structures shown in FIG. 4B) to a grounded C4 structure on the front surface of the device.

Figure 1:
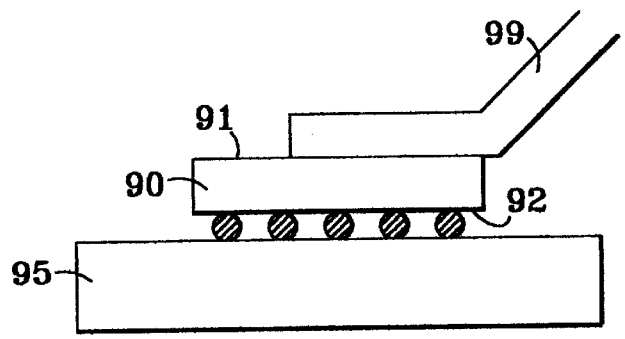
FIG. 1 shows a conventional heat-sinking arrangement for a completed semiconductor device.

In contrast to the heat-sinking arrangement of FIG. 1, the combination of an embedded heat-dissipating layer and a heat-conductive C4 underfill permits heat conduction from the active area through the front side of the device, thus providing a shorter path for heat to reach the external environment.

A process and structure have been described which significantly enhance heat removal from the front side of a semiconductor chip. Accordingly, the reliability of high-power devices, such as advanced application-specific integrated circuits (ASICS), may be significantly increased.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method of forming a heat-dissipating structure in a semiconductor device, comprising the steps of:

forming a first insulating layer on a substantially planar underlying layer of the device;

forming a recess in the first insulating layer, so that a top surface of the first insulating layer has a recessed portion and an unrecessed portion;

filling the recess with a thermally conductive material to form a lateral heat-dissipating layer;

planarizing the heat-dissipating layer so that a top surface thereof is coplanar with the unrecessed portion of the first insulating layer;

forming a second insulating layer on the first insulating layer and the heat-dissipating layer, thereby embedding the heat-dissipating layer between the first insulating layer and the second insulating layer, wherein the heat-dissipating layer is electrically isolated from the underlying layer of the device;

forming an opening in the second insulating layer and in the unrecessed portion of the first insulating layer thereby exposing a portion of the underlying layer of the device, and filling said opening with a metal to make electrical connection to the underlying layer of the device, wherein said electrical connection is electrically isolated from said lateral heat-dissipating layer.

2. A method according to claim 1, further comprising the steps of:

forming an opening in the second insulating layer to expose a portion of the heat-dissipating layer; and filling said opening with a thermally conductive material to make thermal contact with the lateral heat-dissipating layer, thereby forming a vertical heat-dissipating structure.

3. A method according to claim 1, wherein the recess in the first insulating layer is formed using a mask defining a pattern and a first resist material and wherein said opening in the second insulating layer and in the unrecessed portion of the first insulating layer is formed using a mask defining the same pattern and a second resist material.

4. A method according to claim 1, wherein the thermally conductive material is a metal.

5. A method according to claim 1, wherein the heat-dissipating structure is electrically grounded.

* * * * *